United States Patent [19]

Schmid et al.

[11] 4,223,270

[45] Sep. 16, 1980

[54] MULTIPLEXED CCD PULSE WIDTH DISCRIMINATOR

[75] Inventors: Hans-Peter Schmid, Rancho Cucamonga; Richard S. Schlunt, Los Angeles, both of Calif.

[73] Assignee: General Dynamics Corporation Pomona Division, Pomona, Calif.

[21] Appl. No.: 926,582

[22] Filed: Jul. 20, 1978

[51] Int. Cl.³ .............................................. H03K 5/22
[52] U.S. Cl. ........................... 328/112; 307/221 D; 307/234; 328/111; 328/147
[58] Field of Search .................. 328/112, 147, 111; 307/234, 358, 221 D

[56] References Cited

U.S. PATENT DOCUMENTS

| 3,315,168 | 4/1967 | Cantella | 328/112 |
| 3,334,298 | 8/1967 | Monrad-Krohn | 328/114 |
| 3,787,852 | 1/1974 | Puckette et al. | 307/221 D |
| 3,952,188 | 4/1976 | Sloate et al. | 307/221 D |
| 3,997,973 | 12/1976 | Buss | 307/221 D |
| 4,064,408 | 7/1978 | Hon et al. | 307/351 |
| 4,100,513 | 7/1978 | Weckler | 307/221 D |

Primary Examiner—Harold A. Dixon
Attorney, Agent, or Firm—Henry M. Bissell; Edward B. Johnson

[57] ABSTRACT

A pulse width discriminator comprises a tapped analog delay line which preferably is a charge coupled device (CCD). The taps are spaced one sample time apart along the delay line. A correlator output is obtained by summing the outputs of all taps. A pulse amplifier output is obtained by weighting and adding the signals from selected taps. The correlator output corresponds to a low-pass filter. The sample rate is at the Nyquist rate. The pulse amplifier output is a maximum for a pulse width determined by the length of the delay line (in terms of number of sample points) divided by the sample frequency. The correlator output has a maximum corresponding to the maximum of the pulse and can be used to determine the presence of a pulse. This pulse processor is also capable of handling a plurality of inputs by multiplexing them.

18 Claims, 3 Drawing Figures

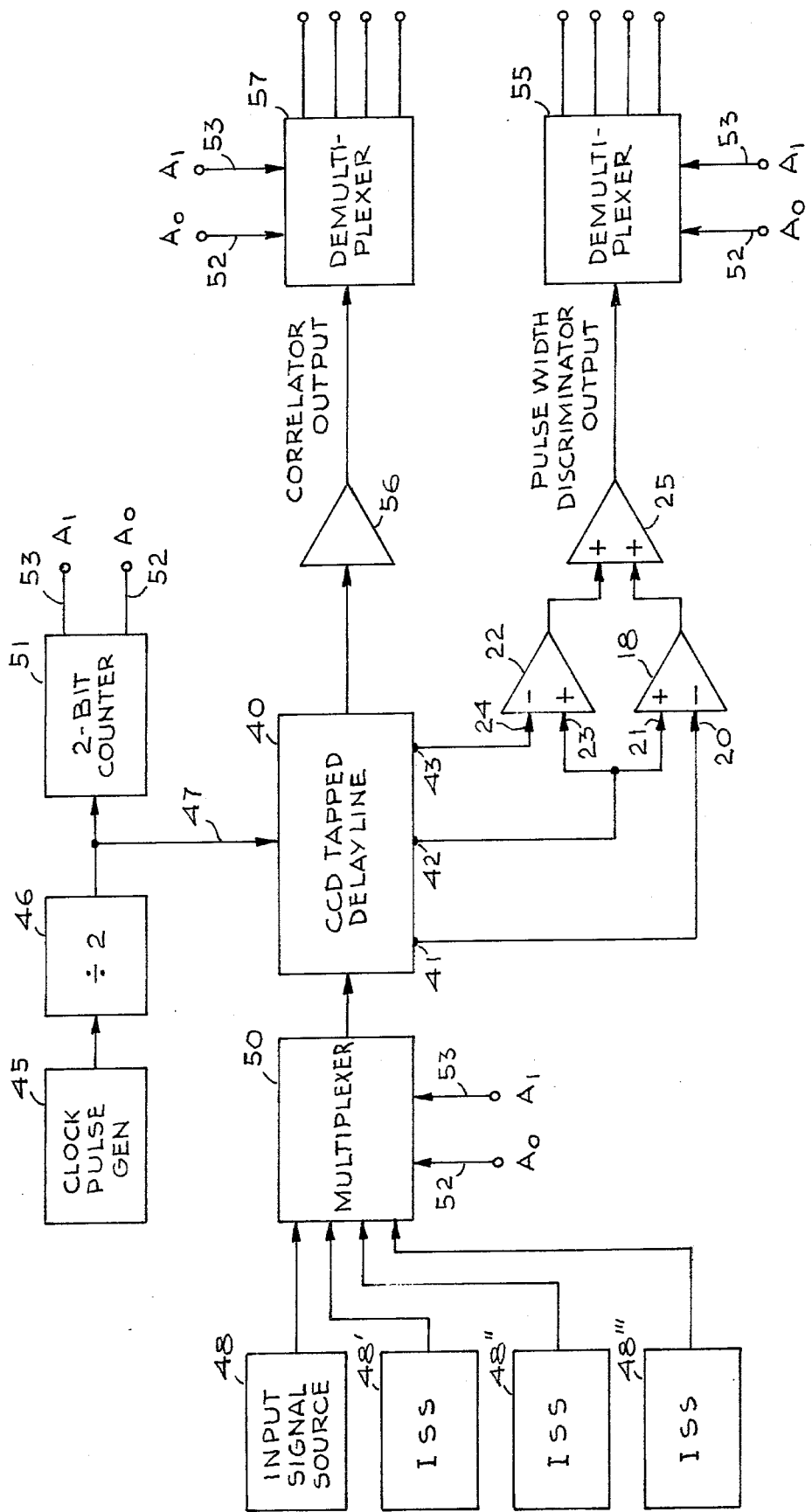

4,223,270

MULTIPLEXED CCD PULSE WIDTH DISCRIMINATOR

BACKGROUND OF THE INVENTION

1. Field of the Invention

This invention relates generally to pulse width discriminators and particularly to a discriminator capable of handling multiplexed input signals.

2. Description of the Prior Art

Many pulse width discriminators have been described in the prior art. Among these is the patent to Smith, U.S. Pat. No. 3,790,881. It discloses a pulse width selector or discriminator. The apparatus accepts or rejects pulses on the basis of pulse duration. The pulses are clocked into a shift register and the counter is checked at the end of the pulse to determine whether the pulse duration is within predetermined limits. Accordingly, this device is entirely digital. The same applies to the patent to Gravett, U.S. Pat. No. 3,978,445. Here a digital counter is used in counting a clock gated by the signal. A similar digital pulse width decoder is disclosed in the patent to Odom, U.S. Pat. No. 3,948,199.

Another group of patents discloses charge coupled devices (CCD). For example, the patent to Puckette et al., U.S. Pat. No. 3,787,852, discloses a plurality of bucket brigade delay line circuits or charge coupled devices. They are used in parallel in a radar receiver signal path. Portions of the received signal are clocked into the bucket brigade delay line circuit serially. Accordingly, each radar pulse repetition period is divided into a plurality of sub-periods, and a selected sub-period is stored in each bucket brigade delay line circuit. These may then be processed by moving target indicator (MTI) techniques.

The patent to Cheek, Jr., et al., U.S. Pat. No. 3,947,698, also utilizes a charge coupled device which is utilized as a shift register and performs multiplexing functions only. However, the patent does not direct itself to pulse width discrimination.

The patent to Leach, Jr., U.S. Pat. No. 4,028,671, discloses a CCD recirculating memory to recirculate data. There is no disclosure how this could be used for pulse width discrimination.

Finally, the patent to Mattern, U.S. Pat. No. 4,063,200, discloses a multiplexed filter bank having a digital-to-analog multiplier for weighting sampled input signals. The multiplexed filter bank forms a rather general multiplexed recursive filter.

SUMMARY OF THE INVENTION

In accordance with the present invention, there is provided a pulse width discriminator. The discriminator of the invention lends itself particularly well to a multiplexed pulse width discriminator.

The output of certain scanning devices, such as an electro-optical device, consists of electrical pulses. The width of the pulses may correspond, for example, to different objects being scanned. In order to identify a particular desired object, it is necessary to be able to distinguish pulse width or pulse duration. The scanner may, for example, consist of an infrared scanner having an output consisting of pulses having widths of a predetermined distribution. Here the size of the object corresponds to the width of the output pulse.

Frequently the scanner has more than one detector and, hence, several output signals, each containing pulses, which are to be processed. In order to minimize the required equipment and expense, it is desirable to provide a single processor capable of handling multiple inputs.

In accordance with the present invention, this is accomplished by utilizing an analog delay line having a predetermined number of taps. Preferably, the delay line is a charge coupled device. A signal source generates a signal including pulses of different widths, the signal source being coupled to the delay line. A clock pulse generator is also coupled to the delay line for periodically sampling the signal impressed on a delay line. The time delay between the first and the last tap, as determined by the sample rate, corresponds to a predetermined delay which is the width or duration of the desired pulses. Finally, means are provided for weighting and adding the sampled signals obtained from selected taps on the delay line. This will provide a pulse width discriminator output.

By way of example, the delay line may be provided with a first, an intermediate and a last tap. The length of the delay line between the first and the last tap, correlated to the sample period provided by the clock pulse generator, equals the width of the desired pulses. By subtracting the signals obtained from the first and last taps and adding twice the signal amplitude of the intermediate tap, a pulse width discriminator output is obtained. This output will strongly discriminate against pulses having a pulse width or duration more than the desired duration.

The system may readily be converted to operate for a plurality of input signals. In this case, the input signals are impressed on a multiplexer which is synchronized with the sample rate. The output signal of the delay line is demultiplexed in synchronism with the multiplexing rate.

The novel features that are considered characteristic of this invention are set forth with particularity in the appended claims. The invention, itself, however, both as to its organization and method of operation, as well as additional objects and advantages thereof, will best be understood from the following description when read in connection with the accompanying drawings.

BRIEF DESCRIPTION OF THE DRAWINGS

FIG. 3 is a block diagram of a multiplexed pulse width discriminator having four input signals and a CCD tapped delay line and demultiplexed outputs.

DESCRIPTION OF THE PREFERRED EMBODIMENT

Figure 1:
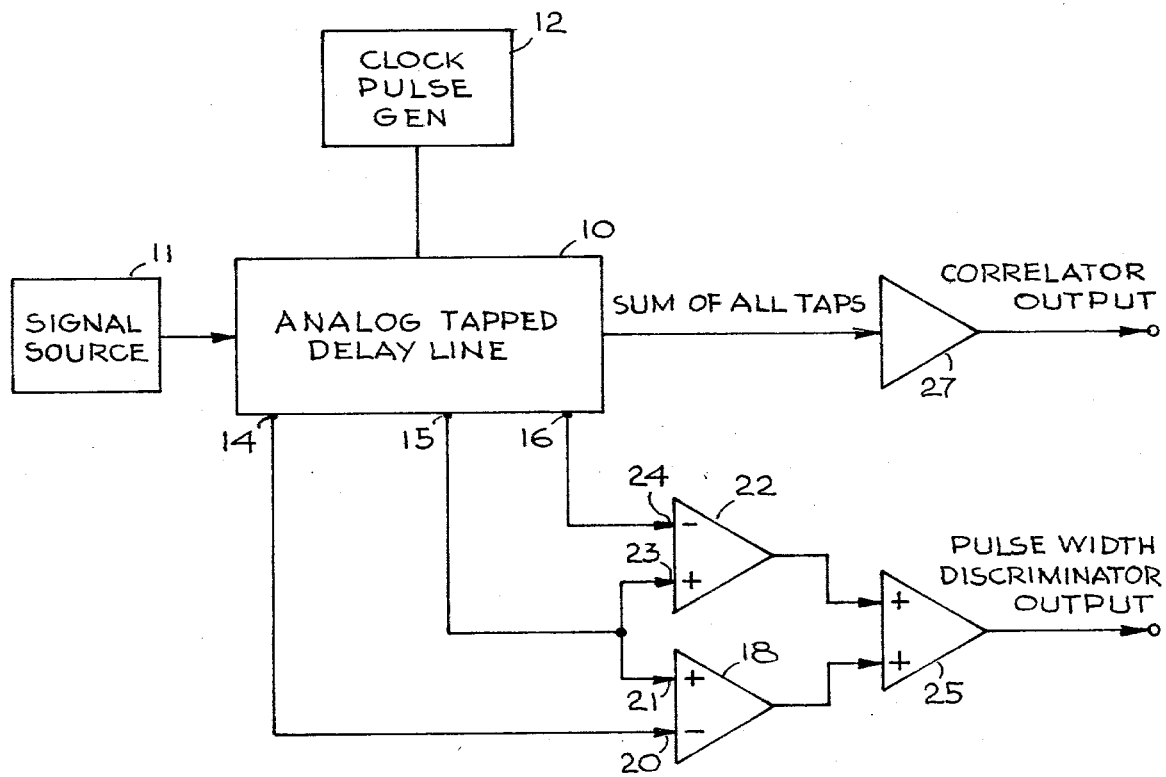
FIG. 1 is a block diagram of a pulse width discriminator embodying the present invention and utilizing an analog tapped delay line for discriminating the pulse width of pulses from a single signal source.

Referring now to FIG. 1, there is illustrated an embodiment of the present invention. The pulse width discriminator or pulse processor includes an analog tapped delay line 10. This could be any type of analog delay line. Preferably, however, the delay line 10 is a charge coupled device. For the present application, a charge coupled device has several advantages. It is a practical device, readily obtainable in the trade, and is provided with taps. It is characterized by its simplicity and it is possible to obtain delays from tens of microseconds up to about 100 milliseconds.

A signal source 11 is coupled to the input of the delay line 10. As explained hereinbefore, the signal source may, for example, be the output of an electro-optical system, such as an infrared scanner. It may include various pulses of different widths or time durations. The discriminator of the invention will select pulses of a predetermined width and reject wider pulses.

By way of example, the desired pulse width at the halfvoltage point may be 100 microseconds. However, as explained hereinafter, the range of the pulse width discriminator of the invention may be on the order of ten to one.

A clock pulse generator 12 is coupled to the analog delay line 10. The clock pulse signals or pulses determine the desired sample rate. Thus, assuming a length of the delay line corresponding to 10 sample periods, the clock pulse frequency of the generator 12 should be 50 khz. This corresponds to a sample time of 20 microseconds. Assuming a length of the delay line of 10 sample periods between 11 taps on the delay line 10, the time delay between the first and the last tap on the delay line amounts to 200 microseconds.

In the example of FIG. 1, the delay line 10 is provided with three selected taps, 14, 15 and 16 which are preferably equally spaced. By way of example, taps 14, 15 and 16 may correspond to taps 1, 6 and 11 on the delay line with a spacing of five sample periods between each two adjacent taps.

It should be noted that the sample frequency corresponding to the clock pulses of generator 12 should be the Nyquist rate. The Nyquist rate is defined as the maximum rate at which code elements can be unambiguously resolved in a communication channel having a limited range of frequencies.

In order to obtain a pulse width discriminator output, the sampled signals obtained from taps 14, 15 and 16 are weighted and added. To this end, there may be provided a first differential amplifier 18 having a negative input 20 and a positive input 21. The negative input 20 is connected to tap 14, and the positive input 21 is connected to tap 15. A second differential amplifier 22 has a positive input 23 which is also connected to the intermediate tap 15, while the last tap 16 is connected to the negative input 24 of the second differential amplifier 22. The outputs of the two differential amplifiers 18 and 22 are summed by another differential or summing amplifier 25 having two positive inputs.

It will be understood, however, that the weighting and adding may be accomplished in a simpler manner. For example, by utilizing a single differential amplifier, such as 18, to the negative input of which the summed signals from taps 14 and 16 are applied, while the signal from tap 15 at twice the amplitude of the other signals, is applied to the positive input terminal.

A correlator output may also be obtained by summing the sampled signals from all taps of the delay line 10. These are summed by a summing amplifier 27 which in turn yields the correlator output.

It should be noted that if the analog delay line 10 consists of a charge coupled device, it usually has to be driven or sampled by two clock pulses 180° out of phase with respect to each other.

It should also be noted that the delay line 10 is an analog delay line which, of course, includes a charge coupled device. Hence, the system operates as an analog signal system.

The output of the correlator amplifier 27 is a low-pass filter of the form sin x/x. The correlator output is useful and can be utilized, for example, to determine whether the input did contain a pulse. The correlator output is a monotonic function because it adds the signals from all the output taps. However, as a pulse is processed through the delay line, the correlator output eventually decreases again because the pulse will move through the delay line which may be considered to be a window through which one sees a moving pulse.

The time delay between taps 14 and 16 determined by the sample rate provided by the clock pulse generator 12 is substantially equal to the base pulse width of a desired pulse. In other words, considering the delay line a window, a pulse of the desired width will just fit into this window.

For that reason, it will be obvious that the pulse processor may readily be adjusted for different pulse widths. This may either be effected by increasing or decreasing the frequency of the clock pulse generator 12. Alternatively, the physical width or length between the first tap 14 and the last tap 16 may be increased or decreased to provide a different pulse width while maintaining the sample rate constant. Thus, considering again the delay line a window, different pulse widths are selected either by changing the velocity of the pulses as they pass the window or by changing the length of the window, keeping the pulse velocity constant.

Figure 2:
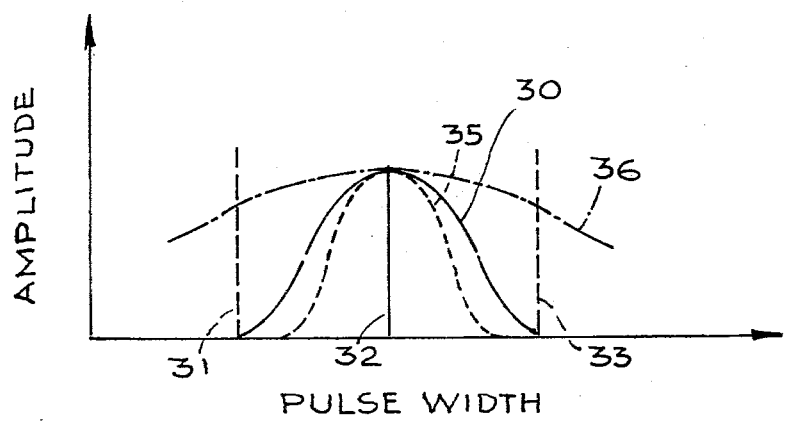
FIG. 2 is a chart illustrating pulses of different pulse widths in equal amplitude to explain the operation of the discriminator of FIG. 1.

The effect of the sampling and weighting may now be explained by means of FIG. 2. Here curve 30 indicates the width of a desired pulse. The pulse is sampled in time and observable as shown by a first line 31, an intermediate line 32 and a last line 33. The lines 31, 32 and 33 correspond, respectively, to the taps 14, 15 and 16 of FIG. 1. It will now be seen that the pulse amplitude obtained at lines 31 and 33 is subtracted, while that of line 32 is added at twice the signal amplitude. This procedure will, of course, yield an output pulse of maximum amplitude.

If the pulse width of another pulse 35 shown by dashed lines is sampled in the same manner, it will be evident that at sample periods corresponding to lines 31 and 33, no output will be obtained, while the output at line 32 is a maximum. It will, of course, be understood that the amplitude of all pulses, such as 30, 35, is made equal.

Considering now a pulse 36 shown in dot-dashed lines, it will be seen that it has a considerably greater pulse width or duration. Here the pulse amplitude at lines 31 and 33 is relatively large, and when subtracted from twice the amplitude obtained at line 32, will yield an output pulse of very small amplitude which can be readily discriminated against by an amplitude discriminator.

In general, for the system of FIG. 1, the following equation holds:

$$f_c = n/w \tag{1}$$

where $f_c$ is the clock rate of clock pulse generator 12, n is the number of samples desired between the half-voltage points of the input pulse, and w is the width of the desired pulse between the half-voltage points.

Hence, if $f_c$ is 50 khz, and the tap spacing between taps is 5, corresponding to 10 samples, the system will select pulses having a width or duration at the half-voltage point of 100 microseconds.

FIG. 3, to which reference is now made, illustrates in block form, a preferred embodiment of the present invention for processing simultaneously, a plurality of input signals. The system of FIG. 3 includes a CCD tapped delay line 40 which may again be provided with three output taps 41, 42 and 43. The delay line 40 is caused to sample a multiplexed analog signal by a clock pulse generator 45, the output of which is divided by 2 by the divider 46. Thus, the CCD delay line 40 is driven by the signal on lead 47 which consists of output pulses being 180° out of phase with respect to each other.

A plurality of input signal sources 48, 48', 48", etc., is connected to the input of a multiplexer 50. As shown in FIG. 3, there may be by way of example, four input signal sources 48, 48', etc. The multiplexer 50 is driven in synchronism with the delay line 40 by means of a two-bit counter 51 having its input coupled to the divider 46 for generating two output signals $A_0$ and $A_1$, obtainable from the output leads 52 and 53. The leads 52 and 53 corresponding to output signals $A_0$ and $A_1$ are impressed on the multiplexer 50, as shown. The multiplexer 50 has its output coupled to the input of delay line 40.

The sampled signals obtained from taps 41, 42 and 43 are again weighted and added as in FIG. 1 by a first differential amplifier 18 and a second differential amplifier 22 connected as explained before to subtract the sampled signals from taps 41 and 43 from twice the signal amplitude obtained from tap 42. The outputs of the two differential amplifiers 18 and 22 are then summed by summing amplifier 25, the output of which is a pulse width discriminator output which is applied to a demultiplexer 55 which is also driven by the signals from leads 52 and 53 of the two-bit counter 51.

The sum of every fourth tap (for the four input example of FIG. 3) of delay line 40 is summed by amplifier 56 and is applied to a second demultiplexer 57 which also is driven by the signals $A_0$ and $A_1$ applied thereto by leads 52 and 53. It will thus be seen that the multiplexer 50 and the two demultiplexers 55 and 57 are operated in synchronism with the sample pulses applied to delay line 40.

As shown by the following equation:

$$f_c = k f_o \qquad (2)$$

the sample frequency is $f_c$, $f_o$ is some basic frequency, and k is the number of input signals.

The taps are located, as shown by the following series:

$$1, k+1, 2k+1, 3k+1, \ldots nk+1 \qquad (3)$$

By way of example, the taps may be separated from each other by twelve sample periods. Thus, the three taps may correspond to tap locations 1, 13 and 25. Also, in the case of the example of FIG. 3, k corresponds to 4, that is, 4 data channels. Otherwise, the circuit shown in FIG. 3 operates like that of FIG. 1. The outputs of the two demultiplexers 55 and 57 correspond again to the four separate input signals.

There has been thus been disclosed a pulse width discriminator which is basically an analog device. It includes an analog delay line which preferably is a charge coupled device. The delay line has a number of taps, some of which are selected for sampling purposes. The delay line is sampled by a clock pulse generator. The distance between the first and the last selected taps as determined by the sample rate should correspond to the width or duration of the desired pulse. The weighting and sampling are such that the pulse width discriminator output discriminates against pulses having a duration substantially greater than the selected duration. The pulse width discriminator of the invention may readily be converted to different pulse widths or durations by either changing the sample frequency or the location of the taps and, hence, the length of the total sample period. The pulse width discriminator of the invention readily lends itself to a single pulse processor for a plurality of input signals. The input signals are passed through a multiplexer into the delay line and are again demultiplexed at the output. The multiplexer and demultiplexers are operated in synchronism with the sample period of the delay line. The system will also provide a correlator output which is useful for further analyzing the output signals and for determining, for example, whether there has been an input pulse or not.

Although there have been described above specific arrangements of a multiplexed CCD pulse width discriminator in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. A pulse width discriminator comprising:
   an analog delay line, said delay line having a predetermined number of taps corresponding to a predetermined delay between said taps;
   a signal source for generating a signal including pulses of equal amplitude but different widths, said signal source being coupled to said delay line;
   a clock pulse generator coupled to said delay line for periodically sampling the signal impressed on said delay line; and
   means for weighting and adding the sampled signals obtained from selected ones of said taps on said delay line in accordance with a predetermined order to provide a pulse width discriminator output containing different amplitude signals corresponding to input pulses of different widths.

2. A discriminator as defined in claim 1 wherein said delay line comprises a charge coupled device.

3. A discriminator as defined in claim 2 wherein the frequency of said clock pulse generator is determined by the number of desired samples divided by the width of the pulses to be discriminated.

4. A discriminator as defined in claim 3 wherein said delay line is provided with a first, an intermediate and a last tap, said three taps being equally spaced to generate three samples, and wherein means are provided for subtracting the sampled signals obtained from the first and the last tap while adding twice the amplitude of the sampled signal obtained from the intermediate tap.

5. A discriminator as defined in claim 4 wherein said means for adding and subtracting said signals consists of a first differential amplifier having a negative input and means for connecting said first tap to said negative input and having a positive input and means for connecting said intermediate tap to said positive input, and a second differential amplifier having a positive input and means for connecting said intermediate tap to said positive input, said second differential amplifier having a negative input and means for connecting said last tap to said negative input, and means for adding the outputs of said two amplifiers.

6. A discriminator as defined in claim 2 further including means for adding the sampled signals obtained from all of the taps of said delay line corresponding to a low-pass filter to derive a correlator output.

7. A pulse width discriminator for simultaneously discriminating the pulse widths of several input pulse signals, said discriminator comprising:
an analog delay line having a predetermined number of output taps;
a plurality of input signal sources, each including pulses the widths of which are to be discriminated;
a clock pulse generator coupled to said delay line for periodically sampling the signals applied thereto, the time delay between the first one and the last one of said output taps as determined by the sample period determined by said generator being equal to the time duration of the desired pulses;
a multiplexer connected to said input signal sources for multiplexing signals therefrom and means for coupling the multiplexed signals to said delay line;
means coupling said pulse generator to said multiplexer for sampling the input signals in synchronism with the sample rate of said delay line;
means connected to a plurality of predetermined taps on said delay line for weighting and adding the corresponding output signals; and
a first demultiplexer connected to said means for weighting and adding said signals, said first demultiplexer being coupled to said pulse generator for demultiplexing the signals applied thereto in synchronism with the sampling and multiplexing rate.

8. A discriminator as defined in claim 7 wherein said delay line consists of a charge coupled device having a predetermined length and a predetermined number of taps.

9. A discriminator as defined in claim 8 wherein the frequency of said clock pulse generator equals the number of taps on said delay line divided by the width of the desired pulse.

10. A discriminator as defined in claim 9 wherein said delay line is provided with a first, an intermediate and a last tap, said three taps being equally spaced, and wherein means are provided for subtracting the output on said first and last tap and adding twice the amplitude of the sampled signal from said intermediate tap.

11. A discriminator as defined in claim 10 wherein said means for subtracting and adding the signals includes a first differential amplifier having a positive and a negative input, and means for connecting said first tap to said negative input and said intermediate tap to said positive input, and a second differential amplifier having a positive and a negative input and means for connecting the positive input of said second amplifier to said intermediate tap and for connecting said last tap to the negative input of said second amplifier, and means for adding the outputs of said two amplifiers.

12. A discriminator as defined in claim 8 wherein means are provided for adding the outputs of all taps of said delay line to provide a correlator output, and a second demultiplexer coupled to the output of said correlator, said second demultiplexer being coupled to said clock pulse generator for demultiplexing the correlator output.

13. A pulse width discriminator comprising:
an analog charge coupled device delay line, said delay line having a predetermined number of taps;
a signal source for generating a pulse signal including pulses of equal amplitude but different widths, said signal source being coupled to said delay line;
a clock pulse generator coupled to said delay line for periodically sampling the signal impressed on said delay line, the time delay obtained between a selected first and last tap on said delay line determined by the sample rate provided by said clock pulse generator and being substantially equal to the pulse width of the desired pulses; and
means for weighting and adding the sampled signals obtained from selected ones of said taps to provide a pulse width discriminator output containing different amplitude signals corresponding to input pulses of different widths.

14. The method of discriminating the pulse width of pulses of different widths contained in an input signal, said method comprising the steps of:
passing the input signal containing pulses of different widths through an analog delay line;
sampling the delay line at a predetermined sample rate in response to an applied clock signal, the delay line having a predetermined number of taps thereon, the time delay between the first and last taps as determined by the sample rate being equal to the pulse width of the desired pulses; and
weighting and adding the outputs of predetermined taps of said delay line to obtain a pulse width discriminator output containing different amplitude signals corresponding to input pulses of different widths.

15. The method defined in claim 14 wherein the signals from all of the taps of the delay line are sampled to obtain a separate correlator output for detecting a pulse of any width.

16. The method defined in claim 14 wherein the taps from which the signals to be weighted are derived are equally spaced.

17. The method defined in claim 16 wherein three taps are provided corresponding to a first, an intermediate and a last tap, and wherein the signals from the first and last taps are subtracted from twice the signal amplitude from the intermediate tap to obtain a pulse width discriminator output.

18. The method defined in claim 17 wherein the sample frequency is determined by the number of samples desired divided by the width of the desired pulses.

* * * * *